United States Patent
Mori et al.

[11] Patent Number: 5,962,886
[45] Date of Patent: Oct. 5, 1999

[54] SEMICONDUCTOR MEMORY AND METHOD OF MANUFACTURING THEREOF

[75] Inventors: Kiyoshi Mori; Junichi Tsuchimoto; Masami Matsumoto, all of Tokyo, Japan

[73] Assignee: Mitsubishi Denki Kabushiki Kaisha, Tokyo, Japan

[21] Appl. No.: 08/976,619

[22] Filed: Nov. 24, 1997

[30] Foreign Application Priority Data

May 23, 1997 [JP] Japan .................................. 9-133632

[51] Int. Cl.⁶ .................. H01L 27/108; H01L 29/76; H01L 29/94; H01L 31/119
[52] U.S. Cl. .................. 257/309; 257/307; 257/308; 438/239; 438/241; 438/251; 438/252; 438/254; 438/255; 438/256; 438/394; 438/398
[58] Field of Search .................................. 257/307, 308, 257/309; 438/239, 241, 251, 252, 254, 255, 256, 394, 398

[56] References Cited

U.S. PATENT DOCUMENTS

| | | |
|---|---|---|
| 5,266,514 | 11/1993 | Tuan et al. . |
| 5,338,700 | 8/1994 | Dennisson et al. ........................ 437/60 |
| 5,401,681 | 3/1995 | Dennisson ................................. 437/60 |
| 5,405,801 | 4/1995 | Han et al. . |
| 5,608,247 | 3/1997 | Brown ....................................... 257/306 |
| 5,623,243 | 4/1997 | Watanabe et al. ....................... 257/309 |
| 5,705,838 | 1/1998 | Jost et al. ................................. 257/296 |
| 5,801,413 | 9/1998 | Pan ........................................... 257/301 |

FOREIGN PATENT DOCUMENTS

| | | |
|---|---|---|
| 6-140594 | 5/1994 | Japan . |
| 7-74317 | 3/1995 | Japan . |
| 8-195482 | 7/1996 | Japan . |

OTHER PUBLICATIONS

"42–th Synki Ouyoubuturi Gakkai Yokusyu," T. Hirota et al., Extended Abstract, 1993 ECS Fall Meeting, 93–2, 306.

*Primary Examiner*—Ngân V. Ngô
*Attorney, Agent, or Firm*—McDermott, Will & Emery

[57] ABSTRACT

In the semiconductor device according to the invention, a tubular storage node is formed, then slanting rotation implantation of impurity phosphorus ions is executed for changing the phosphorus concentration and the etching rate at the thermal phosphoric acid treatment time is changed for roughening the surface under good control. Since the surface roughening does not extend to the center of the film of the storage node, the strength of the storage node can be held sufficient. Therefore, the capacitance can be increased.

18 Claims, 7 Drawing Sheets

1: SEMICONDUCTOR SUBSTRATE
1a: IMPURITY REGION
2, 8: INTERPLAYER INSULATING FILM
3: CONTACT
4: STORAGE NODE
4a: HORIZONTAL PART
4b: TUBULAR PART
5: DIELECTRIC FILM
6: CELL PLATE
7: CAPACITOR

1: SEMICONDUCTOR SUBSTRATE
1a: IMPURITY REGION
2, 8: INTERPLAYER INSULATING FILM
3: CONTACT
4: STORAGE NODE
4a: HORIZONTAL PART
4b: TUBULAR PART
5: DIELECTRIC FILM
6: CELL PLATE
7: CAPACITOR

3a: CONTACT HOLE

9: MASK PATTERN

41b: CONDUCTIVE MATERIAL

10: IMPURITY IMPLANTATION DIRECTION

[ BEFORE SURFACE ROUGHENING ]

DISTANCE FROM STORAGE NODE SURFACE [Å]

[ AFTER SURFACE ROUGHENING ]

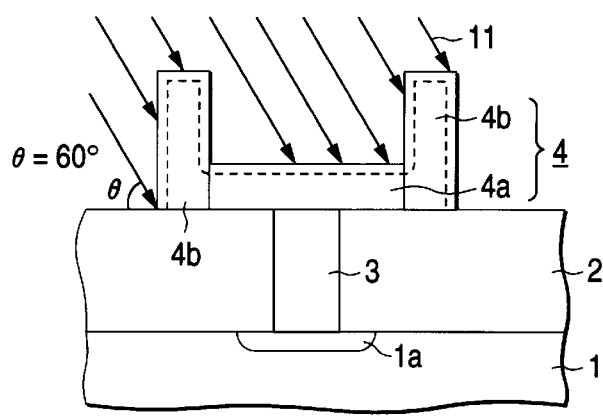
FIG. 12
11: IMPURITY IMPLANTATION DIRECTION
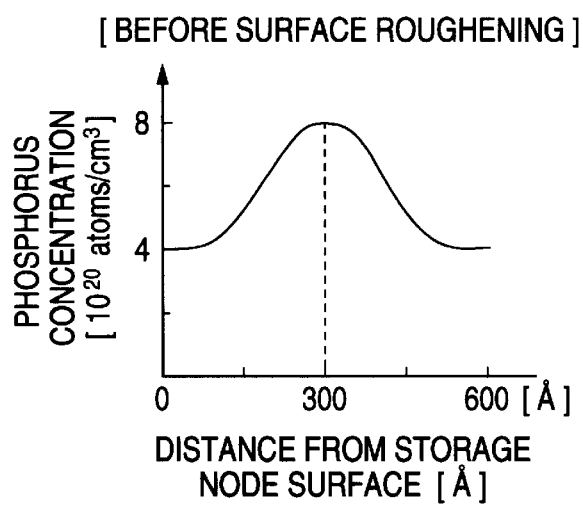
FIG. 13 (a) [BEFORE SURFACE ROUGHENING]
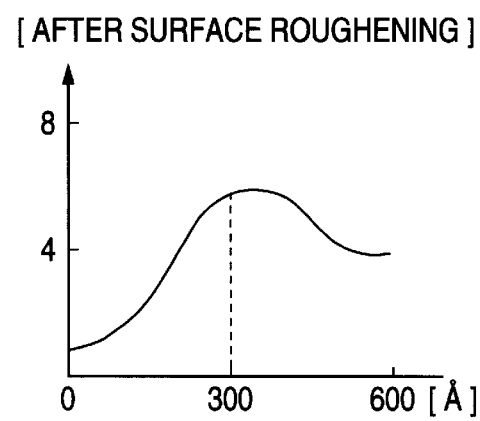
FIG. 13 (b) [AFTER SURFACE ROUGHENING]
DISTANCE FROM STORAGE NODE SURFACE [Å]
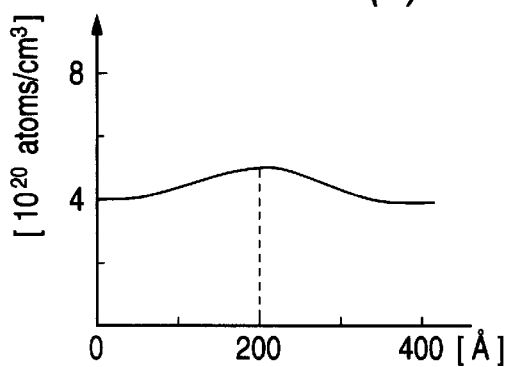
FIG. 14 (a)
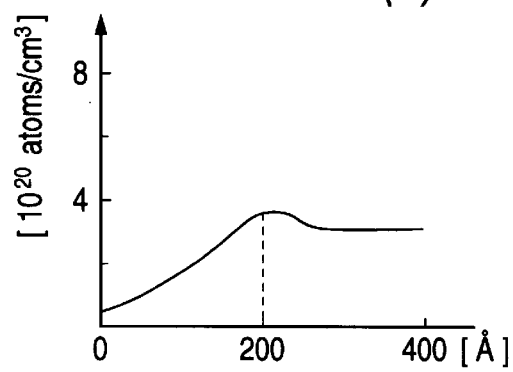
FIG. 14 (b)

4c: TUBULAR PART

SEMICONDUCTOR MEMORY AND METHOD OF MANUFACTURING THEREOF

BACKGROUND OF THE INVENTION

1. Field of the Invention

This invention relates to a semiconductor device and a method of manufacturing thereof and in particular to a structure of a semiconductor device having a capacitor electrode of a semiconductor integrated circuit typified by a storage device or an information device.

2. Description of the Prior Art

For example, attention is focused on a simple stacked typed, fin, or tubular (cylindrical) structure as a capacitor structure having an extent not only in the horizontal direction, but also in the height direction to provide a sufficient capacitance in a limited space for high integration following 64-M DRAMs (dynamic random access memories). Further, a method of applying chemical treatment to a storage node electrode (a lower electrode of a capacitor), thereby forming microscopic asperities on the surface of the electrode for increasing the surface area is already designed to increase the capacitor capacitance.

FIG. 17 is a sectional view of a part of a semiconductor device when the surface of a capacitor electrode is roughened using a technique described on "dai42kai shunki ouyou buturi gakkai yokoushuu 2," 30p-R-16.

In FIG. 17, numeral 101 denotes a semiconductor substrate, numeral 102 denotes an impurity region selectively placed and formed on the surface of the semiconductor substrate 101, numeral 103 denotes an interlayer insulating film laminated on the surface of the semiconductor substrate 101, numeral 104 denotes a contact formed at a depth from the surface of the interlayer insulating film 103 to the surface of the semiconductor substrate 101 so as to abut the impurity region 102, and numeral 105 denotes a thick film storage node laminated on the surface of the interlayer insulating film 103 and electrically connected to the contact 104.

After the storage node 105 is formed, surface roughening is performed and asperities are formed on the surface of the side opposed to a cell plate later formed.

The surface roughening is performed as follows:

First, the storage node 105 is formed of phosphorus-doped polysilicon, then is activated by thermal treatment. Annealing is performed in a $N_2$ atmosphere depending on the activation degree of impurity phosphorus in the storage node 105 before the surface roughening. Next, a thermal phosphoric acid is used to etch phosphorus doped in the storage node 105. Here, since phosphorus is easily segregated to grain boundaries of polysilicon, the grain boundaries are selectively etched and the surface is roughened.

It is seen that according to the surface roughening method described on "42-th Spring Ouyou Buturi Gakkai yokoushuu 2," 30p-R-16, the surface of a storage node of thick film stack type is roughened and the surface area can be increased to 1.4 times that before the surface is roughened.

However, application of the surface roughening method according to the prior art to a storage node of a tubular structure involves a problem. The storage node of thick film stack type shown in the prior art has a large film thickness and becomes a stable shape after the surface is roughened, but if the film forming the tubular storage node has a small thickness and the surface in the tubular portion is too much roughened, the strength as an electrode cannot be maintained and in an extreme case, the tubular portion falls down or peels off.

Especially in the case of the storage node, it is difficult to make a roughness of the surface through outer periphery, inner periphery of the tubular portion and a surface of horizontal portion, uniform. Thereby a reliable capacitor having accurate capacitance, can be obtained.

Further in the case of roughening a surface, since is difficult to control an etching depth, it is difficult to control a capacitance stable and accurately.

Even if a shape of the storage node can be controlled accurately, contact characteristic with a dielectric layer formed on the storage node is not sufficient. So it is required to make a surface state of the storage node uniform, to prevent a current concentration and to improve a contact characteristic.

SUMMARY OF THE INVENTION

It is therefore an object of the invention to roughen the surface under good control for increasing the surface area of a capacitor in a state in which the strength of a capacitor electrode of a tubular structure is held sufficient.

According to aspect of the invention, there is provided a semiconductor device comprising an interlayer insulating film laminated on one main face of a semiconductor substrate, a contact formed at a depth from a surface of the interlayer insulating film to a surface of the semiconductor substrate, a horizontal portion made of a conductive material coming in contact with the contact and spread in a horizontal direction on the surface of the interlayer insulating film, a portion preferably tubular or fin-shaped, made of a conductive material surrounding the outer periphery of the horizontal portion and extending in a vertical direction, a dielectric film laminated on a surface of a storage node made up of the horizontal portion and the tubular portion, and a cell plate made of a conductive material laminated on a surface of the dielectric film. A face from a surface of the storage node on the side facing the cell plate to the film inside of the storage node is roughened and that the impurity phosphorus concentration peak is positioned in the range in which the face is roughened.

In the semiconductor device in accord with another aspect of the invention, the range in which the face of the storage node is roughened is the range of the surface of the storage node to a depth of less than a half of the dimension of the horizontal film thickness of the tubular portion.

Preferably in the range in which the face of the storage node is roughened, recesses are made in the grain boundaries of polysilicon or amorphous silicon grains forming the storage node for roughening the face.

In accordance with a further aspect of the invention, there is provided a semiconductor device manufacturing method comprising the steps of laminating an interlayer insulating film on one main face of a semiconductor substrate, forming a contact abutting the semiconductor substrate in the interlayer insulating film, patterning a horizontal portion made of a conductive material spread in a horizontal direction so as to come in contact with the contact on the interlayer insulating film, forming a tubular portion made of a conductive material being in contact with the outer periphery of the horizontal portion and extending upward like a tube for producing a storage node made up of the horizontal portion and the tubular portion, executing slanting rotation implantation of impurity phosphorus into the storage node made up of the horizontal portion and the tubular portion, executing thermal phosphoric acid treatment for the storage node for roughening a face thereof, laminating a dielectric film on a surface of the storage node, and laminating a conductive material becoming a cell plate on a surface of the dielectric film.

Preferably, implantation energy of impurity phosphorus is 10–50 keV.

In addition, the impurity phosphorus implantation amount preferably is in the range of $2\times10^{14}$ atoms/cm$^2$ to $1\times10^{16}$ atoms/cm$^2$.

Still further, the face roughening range by the thermal phosphoric acid treatment Preferably is in the range of the surface of the storage node to a depth of less than a half of the dimension of the horizontal film thickness of the tubular portion.

Furthermore, slanting rotation implantation of impurity phosphorus preferably is executed, thereby changing the impurity phosphorus concentration in the storage node for placing the peak of the impurity phosphorus concentration in the range in which the face of the storage node is roughened.

Still further, the tubular portion forming a part of the storage node preferably is made of polysilicon or amorphous silicon.

Figure 4:
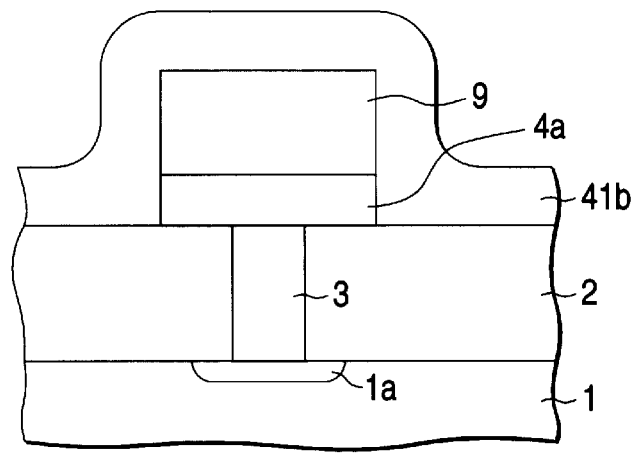
Figure 5:
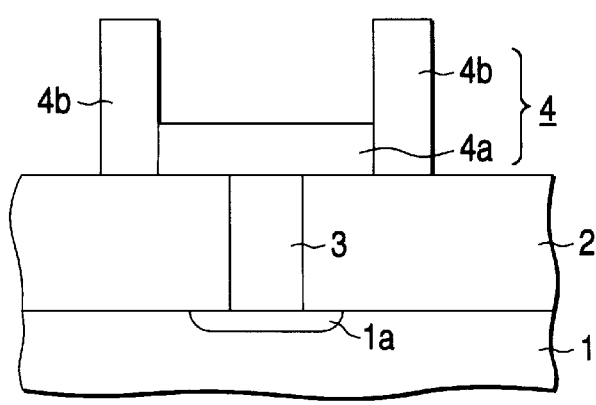
Figure 6:
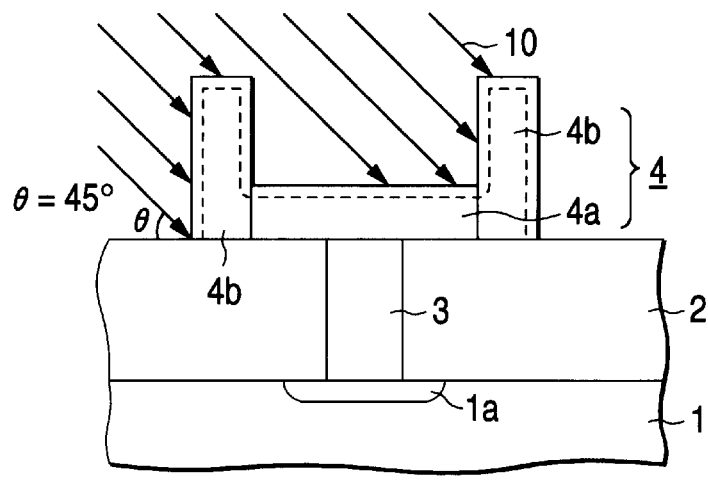
Figure 7:
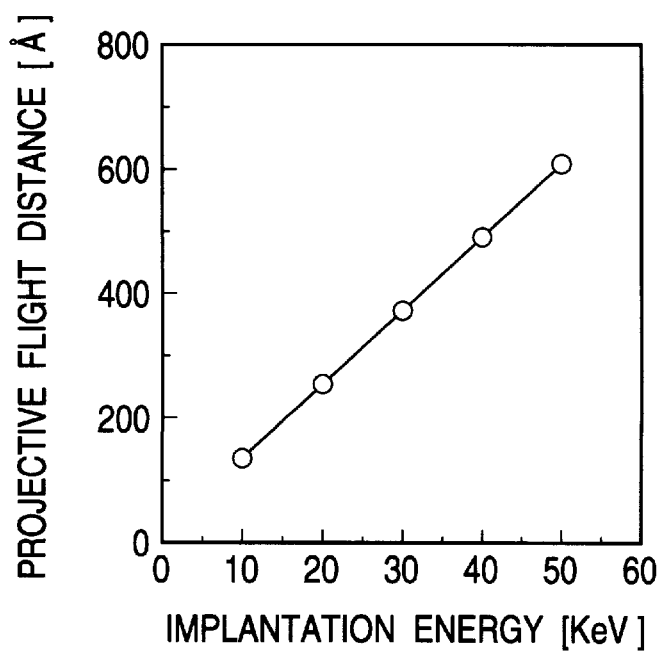
Figure 8:
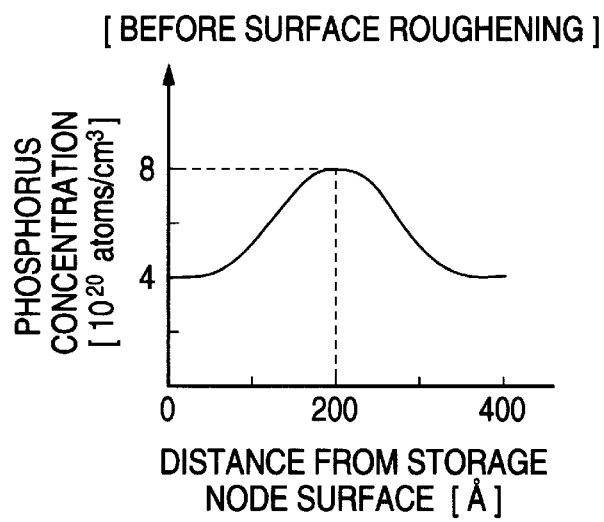
Figure 8:
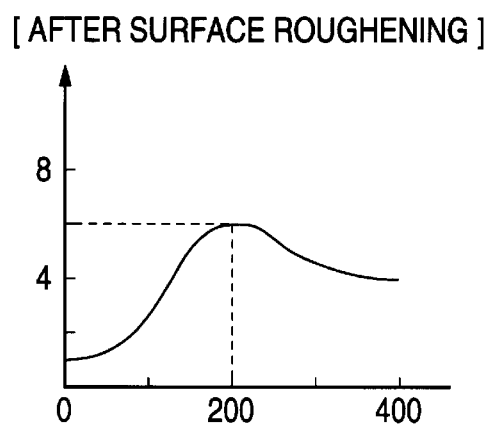
Figure 9:
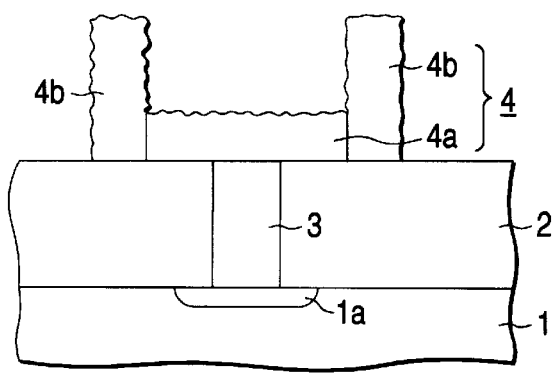
Figure 10:
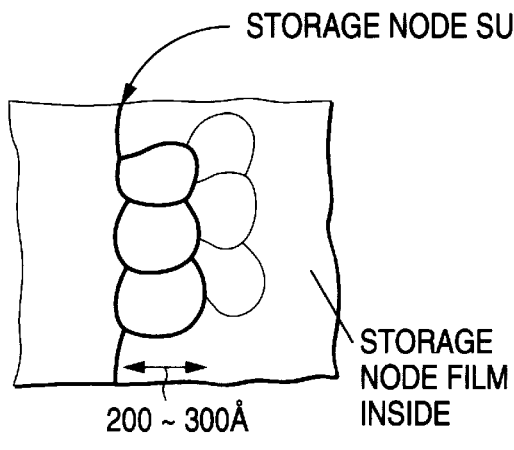
Figure 10:
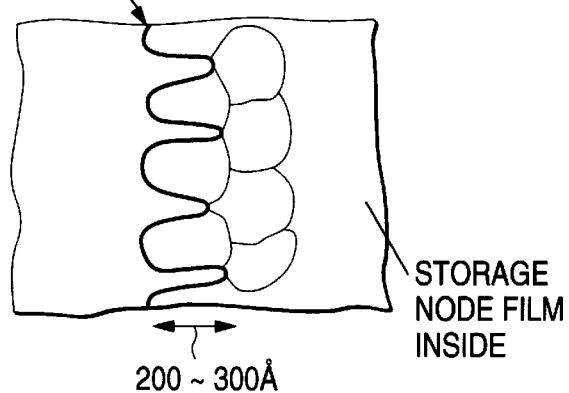
Figure 11:
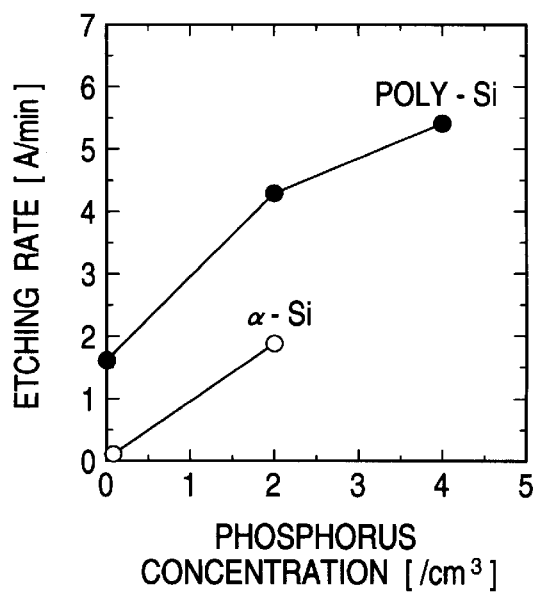
Figure 15:
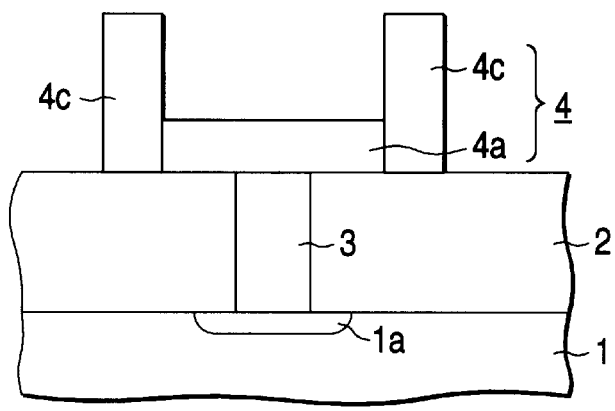
Figure 16:
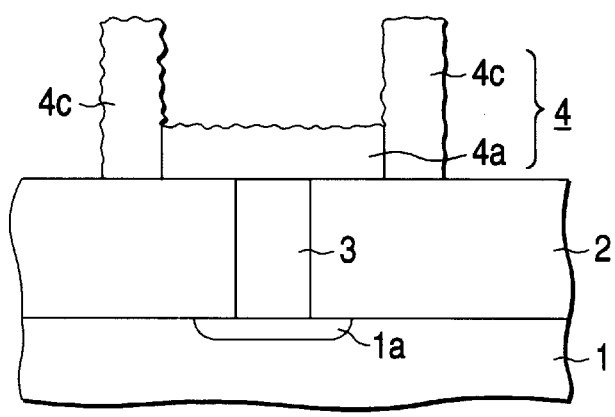
Figure 17:
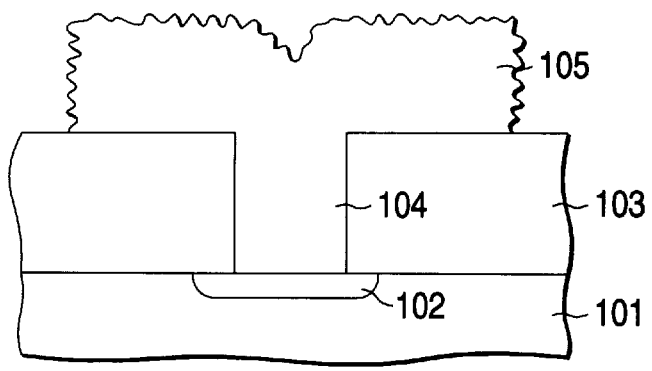

FIG. shows a manufacturing flow of the first embodiment of the invention;

FIG. 4 shows a manufacturing flow of the first embodiment of the invention;

FIG. 5 shows a manufacturing flow of the first embodiment of the invention;

FIG. 6 shows a manufacturing flow of the first embodiment of the invention;

FIG. 7 is an illustration to explain the first embodiment of the invention;

FIG. 8 is an illustration to explain the first embodiment of the invention;

FIG. 9 shows a manufacturing flow of the first embodiment of the invention;

FIG. 10 is an illustration to explain the first embodiment of the invention;

FIG. 11 is an illustration to explain the first embodiment of the invention;

FIG. 12 shows a manufacturing flow of a second embodiment of the invention;

FIG. 13 is an illustration to explain the second embodiment of the invention;

FIG. 14 is an illustration to explain a third embodiment of the invention;

FIG. 15 shows a manufacturing flow of a fourth embodiment of the invention;

FIG. 16 shows a manufacturing flow of the fourth embodiment of the invention; and FIG. 17 is a drawing to show prior art.

DESCRIPTION OF THE PREFERRED EMBODIMENTS

Embodiment 1

A first embodiment of the invention will be discussed.

Figure 1:
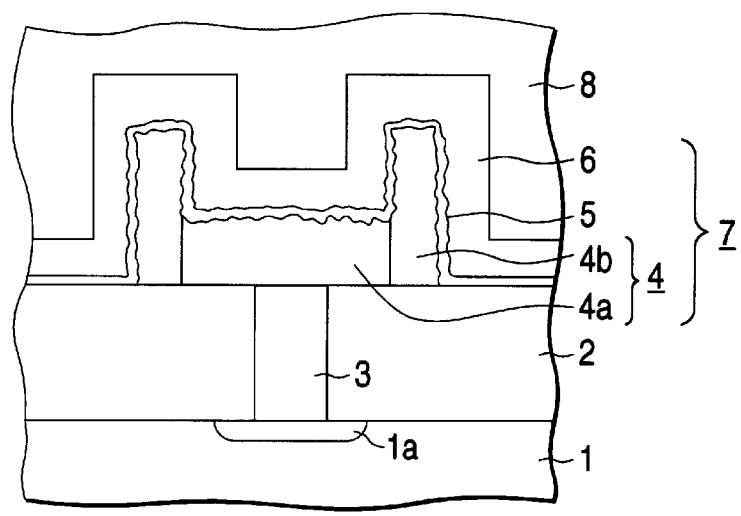
FIG. 1 shows a semiconductor device of a first embodiment o the invention.

FIG. 1 is a sectional view of a semiconductor device according to the first embodiment of the invention, showing a structure of a lower electrode of a capacitor applicable to high-integrated DRAMs following 64-M DRAMs (particularly, future 256-M DRAMs), for example.

In FIG. 1, numeral 1 denotes a semiconductor substrate, numeral 1a denotes an impurity region formed on the surface of the semiconductor substrate 1, numeral 2 denotes an interlayer insulating film laminated on the semiconductor substrate 1, numeral 3 denotes a contact made of a conductive material, embedded in the interlayer insulating film 2, and formed at a depth from the surface of the interlayer insulating film 2 to the surface of the impurity region 1a, numeral 4a denotes a horizontal portion, a part of a storage node 4 forming a part of a capacitor 7, made of a conductive material coming in contact with the top of the contact 3 and patterned as an ellipse on the surface of the interlayer insulating film 2, and numeral 4b is a tubular portion, a part of the storage node 4, made of a conductive material coming in contact with the side cross section of the horizontal portion 4a and extending in the vertical direction.

Further, numeral 5 denotes a dielectric film laminated on the surface of the side becoming a counter electrode of the storage node 4 and numeral 6 denotes a cell plate of an electrode opposed to the storage node 4 via the dielectric film 5. The storage node 4, the dielectric film 5, and the cell plate 6 make up a capacitor 7. Numeral 8 is an interlayer insulating film laminated on the capacitor 7.

The surface of the side of the storage node 4 forming a part of the capacitor 7 of the semiconductor device in FIG. 1 opposed to the cell plate 6 is roughened and random asperities are formed, efficiently increasing the opposed area of the electrode of the capacitor 7.

Further, the surface is roughened under good control, so that the strength of the tubular portion 4b is sufficiently maintained.

Next, a manufacturing method of the semiconductor device in FIG. 1 will be discussed.

Figure 2:
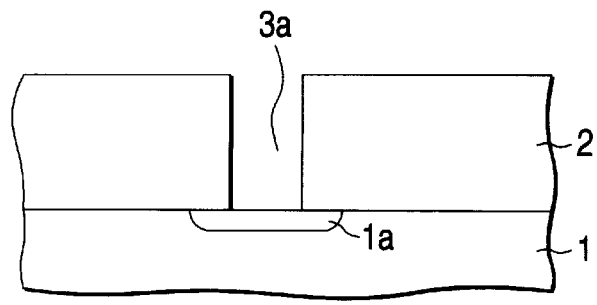
FIG. 2 shows a manufacturing flow of the first embodiment of the invention.

First, as shown in FIG. 2, elements, such as underlayer wiring and MOS transistors, are formed on the surface of the semiconductor substrate 1, then the interlayer insulating film 2 is laminated on the surface of the semiconductor substrate 1 containing the surfaces of the elements. The film thickness of the interlayer insulating film 2 varies depending on the dimensions, etc., of the elements formed on the surface of the semiconductor substrate 1; it is about 4000 A. Next, a resist pattern having a predetermined opening pattern is formed on the surface of the interlayer insulating film 2 and is used as an etching mask to execute anisotropic etching for the interlayer insulating film 2 for making a contact hole 3a having an opening diameter of about 2000 A, exposing a part of the surface of the semiconductor substrate 1. Further, impurity ion implantation is executed for forming an impurity region 1a on the surface of the semiconductor substrate 1 positioned at the bottom of the contact hole 3a selectively. The resist pattern used to make the contact hole 3a is removed before or after the impurity ion implantation. The impurity region 1a can also be formed before the interlayer insulating film 2 is formed.

Figure 3:
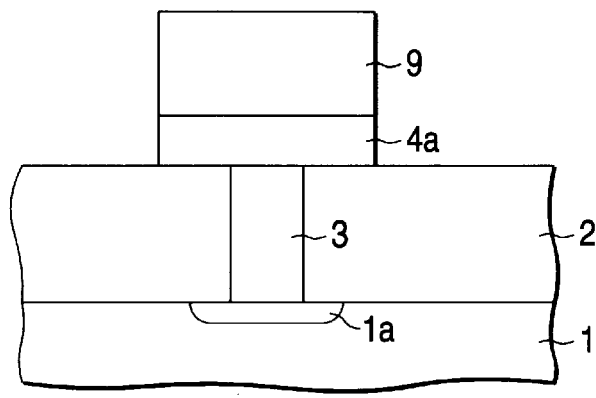

Then, as shown in FIG. 3, a method such as CVD (chemical vapor deposition) or sputtering is used to embed a conductive material in the contact hole 3a on the full surface of the processed substrate having the contact hole 3a already made in the interlayer insulating film 2 (hereinafter, the semiconductor substrate 1 and deposit films on the surface of the semiconductor substrate during manufacturing will be collectively called the processed substrate), forming the contact 3. At the same time, a conductive material becoming the horizontal portion 4a is also laminated about 2000 A thick on the surface of the interlayer insulating film 2.

Further, a mask pattern 9 made of a silicon oxide film 5000 A thick is patterned on the conductive material and the mask pattern 9 is used as an etching mask to pattern the conductive material becoming the horizontal portion 4a for producing the horizontal portion 4a forming a part of the storage node 4. If the horizontal portion 4a is shaped like an ellipse, its longer diameter is set to about 15000 A and its shorter diameter is set to about 5000 A.

Then, as shown in FIG. 4, a conductive material 41b forming the cylindrical portion 4b of a component of the storage node 4 is laminated about 1000 A thick on the surface of the processed substrate at film formation temperatures 575° C.–585° C. and at deposition pressure of 0.45 Torr using a tube-type low pressure CVD system, for example. The impurity phosphorus concentration in the laminated conductive material 41b is prepared to a value of about 4E20 atoms/cm$^3$.

Then, as shown in FIG. 5, anisotropic etching is executed for the conductive material 41b for producing the horizontal portion 4a and the tubular portion 4b, a part of the storage node 4 deposited on the side cross sections of the mask pattern 9 as side walls. The horizontal film thickness of the tubular portion 4b becomes about 1000 A and the vertical dimension of the tubular portion 4b becomes about 7000 A. The horizontal film thickness of the tubular portion 4b also depends on the cell size of the semiconductor device; a proper value of the horizontal film thickness is about 500 A–1000 A. Then, the mask pattern 9 is removed.

Next, as shown in FIG. 6, impurity phosphorus is implanted into the surface of the storage node 4 on the side becoming the counter electrode of the capacitor. In FIG. 6, numeral 10 indicates the impurity implantation direction.

In the impurity phosphorus implantation process, eight-part split impurity slanting rotation implantation is executed for the processed substrate at an angle of 45 degrees. The eight-part split implantation is a method of rotating the semiconductor substrate 1 at 45 degrees (one eighth of 360 degrees) at a time in the horizontal direction with one main face of the semiconductor substrate 1 for changing the angle and implanting impurity phosphorus eight times; the impurity ion implantation angle is set to 45 degrees with one main face of the semiconductor substrate 1. At this time, the implantation energy is adjusted to 20 KeV and the implantation amount to 1E15 atoms/cm$^2$ for implantation.

As shown in FIG. 7, it is known that the projective flight distance of impurity ions is proportional to the magnitude of impurity ion implantation energy. For example, if ion implantation is executed by the implantation energy as mentioned above, the projective flight distance becomes about 250 A.

Here, considering that impurity phosphorus is implanted slantingly into one main face of the semiconductor substrate 1 at an angle of 45 degrees, the impurity peak is positioned at a depth of about 200 A from the surface of the storage node 4 although slight variations exist.

Because of eight-part split rotation implantation, impurity ions can also be implanted into the surface of the storage node 4 on the inside of the tubular portion 4b like the outside of the tubular portion 4b.

FIG. 8 shows impurity profiles from the storage node surface (portion becoming the counter electrode) to the film inside of the storage node 4 after impurity ion implantation. FIGS. 8(a) and (b) show the impurity profiles before and after surface roughening of the storage node 4; the distance from the surface of the storage node 4 to the film inside thereof [A] is indicated on the horizontal axis and the impurity concentration [10$^{20}$ atoms/cm$^3$] is indicated on the vertical axis.

As shown in FIG. 8(a), before surface roughening, the phosphorus concentration has a peak at a depth of about 200_from the surface of the storage node 4 and the impurity concentration at the peak position is represented by the total of the phosphorus concentration of the impurities already contained in the film at the film formation time of the storage node 4 and that of the impurities additionally implanted by slanting rotation implantation (3-4E20 atoms/cm$^3$); it becomes a value of about 7-8E20 atoms/cm$^3$.

After the storage node 4 having the impurity profile as in FIG. 8(a) is provided, thermal phosphoric acid treatment is executed for the storage node 4, thereby providing the storage node 4 having the surface roughened as shown in FIG. 9. Specifically, a wafer is immersed in a bath filled with an 85% H$_3$PO$_4$ water solution at a temperature of about 160_for 60–90 minutes. This thermal phosphoric acid treatment selectively etches and removes phosphorus doped in the storage node. Since phosphorus is easily segregated to polysilicon grain boundaries, the grain boundaries of polysilicon are selectively etched. For example, if the phosphorus concentration peak is at the distance of about 200 A from the surface of the storage node 4 as mentioned above, asperities are formed by the surface roughening in the range of 200 A–400 A from the surface of the storage node 4 although slight variations exist.

After the thermal phosphoric acid treatment, the wafer is washed for 20 minutes and spin-dried for five minutes.

FIG. 8(b) shows distance dependency of the phosphorus concentration of the tubular portion 4b of the storage node 4 from the surface after the surface roughening process. Since phosphorus in the proximity of the surface of the storage node 4 is etched and removed, the phosphorus concentration lessens to about 1E20 atoms/cm$^3$ and a peak exists at the position of a depth of about 200 A as before the surface roughening, but the peak phosphorus concentration becomes smaller than that before the surface roughening. The phosphorus concentration at the center of the film of the tubular portion 4b at a depth of about 500 A does not change after the surface roughening; the same film quality as before the surface roughening is maintained.

FIGS. 10(a) and (b) are partly exploded views of the cross section of the storage node 4 before and after the surface roughening. In FIGS. 10(a) and (b), the thin solid line indicates polysilicon grain boundaries and the thick solid line indicates a region in which impurity phosphorus is segregated in the polysilicon grain boundaries. The storage node 4 is made of polysilicon, as described above. Before the thermal phosphoric acid treatment, as shown in FIG. 10(a), impurity phosphorus is segregated in the polysilicon grain boundaries and is distributed mainly in the region from the surface to a depth of 200 A–400 A.

When thermal phosphoric acid treatment is applied to the surface of the storage node in the state shown in FIG. 10(a), impurity phosphorus positioned on the polysilicon grain boundaries is selectively etched and removed and a groove is formed along the polysilicon grain boundaries in the area from the surface of the storage node to a depth of 200 A–400 A, resulting in the roughened surface, as shown in FIG. 10(b).

Next, FIG. 11 shows the study result of impurity phosphorus concentration dependency of the etching rate when thermal phosphoric acid etching is executed for the storage node 4 made of polysilicon. According to the study, the inventor acknowledges that the impurity phosphorus concentration is closely related to the etching rate of the conductive material forming the storage node 4 and that as the value of the impurity phosphorus concentration grows, the etching rate also grows.

Therefore, the etching rate is large in the proximity of the impurity concentration peak and becomes small at a position deeper than the impurity concentration peak position (namely, the inside of the film forming the storage node 4), the surface roughening reaction of the thermal phosphoric acid treatment can be stopped to the proximity of the impurity concentration peak, and deep penetration of the surface roughening into the film inside of the storage node 4 can be suppressed.

Since penetration of the surface roughening reaction into the film inside of the storage node 4 can be suppressed and the surface roughening process can be suppressed in the proximity of the impurity concentration peak, the surface area of the storage node 4 can be increased, leading to an increase in the opposed area of the capacitor; in addition, the strength of the storage node 4 itself can also be maintained and a good surface roughening process can be executed.

Next, thermal treatment is executed for 30 minutes at a temperature of about 800° C. to activate the roughened surface of the hollow storage node 4 where phosphorus implanted into the storage node 4 of the processed substrate is selectively removed by the thermal phosphoric acid treatment. The inventor acknowledges that if the storage node 4 is activated, the shape of the roughened surface does not change.

Then, an LPCVD system is used to laminate the dielectric film 5 made of a silicon nitride oxide film (ON film) about 60 A thick on the roughened surface of the storage node 4 and furthermore is used to laminate the cell plate 6 made of doped polysilicon about 2000 A thick. At this stage, the capacitor 7 containing the storage node 4 and the cell plate 6 opposed to each other via the dielectric film 5 can be formed.

Then, the interlayer insulating film 8 is laminated on the cell plate 6, whereby a semiconductor device as shown in FIG. 1 can be provided.

For the semiconductor device containing the capacitor 7 formed by the manufacturing method as described above, impurities are implanted under good control so that the impurity phosphorus concentration peak comes to a position at a depth of about 200 A from the surface of the storage node 4, and slanting rotation implantation is executed, whereby impurity phosphorus can also be uniformly implanted into regions into which impurities are hard to implant, of the inside of the tubular portion 4b of the storage node 4 and the surface of the horizontal portion 4a.

Further, when the thermal phosphoric acid treatment is executed for the storage node 4 containing the tubular portion 4b 1000 A thick in the horizontal direction, the surface of the region from the surface of the storage node 4 to a depth of 200 A–400 A is roughened under good control. Thus, the surface roughening does not extend to the center of the conductive film forming the storage node 4, problems of breakage, partial lack, etc., of the tubular portion of the storage node 4 can be solved, and the strength of the film itself can be made sufficient.

Further, the surface of the capacitor having the tubular portion, which may be called cylindrical capacitor in some cases, is roughened by executing thermal phosphoric acid treatment for forming random asperities, whereby the surface area about 1.4 times that when the surface roughening process is not executed can be provided, and a large-capacity capacitor can be provided.

In the description of the manufacturing method, the implantation angle of impurity ion with one main face of the semiconductor device is set to 45 degrees and eight-part split rotation implantation (at a rotation angle of 45 degrees) is shown as an example of slanting rotation implantation. However, this is only an example; impurities may be implanted at different implantation angles or different rotation angles and an impurity distribution having a peak at a determined position from the surface of the storage node 4 needs only to be made finally.

Further, the ion implantation amount when slanting rotation implantation of impurity phosphorus ions is executed into the storage node 4 may be in the range of 2E14 atoms/cm$^2$ to 1E16 atoms/cm$^2$ (equal to the limit value of an ion implanter); if the impurity concentration difference from bulk of the storage node 4 becomes a value of 1E20 atoms/cm$^3$ or more at the peak position, good surface roughening can be executed.

For the semiconductor device manufacturing method, only one example of process conditions is shown. From the viewpoint of providing a structure of a tubular capacitor having the surface roughened wherein the surface roughening does not extend to the center of the film forming the tubular portion of the capacitor and the film strength can be maintained, for example, the impurity phosphorus implantation amount, implantation angle, implantation energy, etc., may take different values and different process conditions can also be used, needless to say.

Embodiment 2

Next, a second embodiment of the invention will be discussed. The final structure of a semiconductor device of the second embodiment is similar to that shown in the first embodiment; the first and second embodiments differ in semiconductor device manufacturing method, specifically in impurity implantation conditions into storage node 4 before surface roughening.

Next, a semiconductor device manufacturing method of the second embodiment of the invention will be discussed.

One storage node 4 of a counter electrode of a capacitor 7 is formed by executing the steps in FIGS. 2–6 described in the first embodiment in order.

Then, slanting rotation implantation of impurity phosphorus is executed into a processed substrate, as shown in FIG. 12.

The impurity implantation conditions are implantation energy 50 keV, implantation amount 1E15 atoms/cm$^2$, and implantation angle 60 degrees for eight-part split rotation implantation.

If impurity phosphorus is implanted under these conditions, the projective flight distance becomes about 600 A because the implantation energy is 50 keV; considering that the implantation angle is 60 degrees, impurities are implanted to a depth of about 300 A from the surface of the storage node 4.

FIG. 13 shows impurity concentration profiles from the surface of the storage node 4 to the film inside thereof when impurity phosphorus is implanted under the conditions as mentioned above.

FIGS. 13(a) and (b) show distance dependency of the phosphorus concentration from the storage node surface before and after surface roughening of the storage node 4;

the depth from the surface of the storage node 4 to the film inside thereof [A] is indicated on the horizontal axis and the impurity phosphorus concentration [$10^{20}$ atoms/cm$^3$] is indicated on the vertical axis.

Before surface roughening, as seen in FIG. 13(a), as the depth from the surface of the storage node 4 increases, the impurity phosphorus concentration grows gradually and reaches a peak at a depth of about 300 A from the surface of the storage node 4; the peak value becomes about 8E20 atoms/cm$^3$. As the depth from the surface of the storage node 4 furthermore increases, the impurity phosphorus concentration lessens gradually and becomes about 4E20 atoms/cm$^3$ at the depth position equivalent to a half of the film thickness of a tubular portion 4b of the storage node 4. This phosphorus concentration equals the concentration of impurities already uniformly contained when the tubular portion 4b is formed of doped polysilicon.

Then, the surface of the storage node 4 is roughened by executing thermal phosphoric acid treatment as shown in the first embodiment.

At this time, impurity phosphorus segregated in the grain boundaries of polysilicon forming the storage node 4 is selectively etched and asperities are formed on the surface of the storage node 4. The surface is roughened under good control in a region where the etching rate is high, namely, the impurity phosphorus concentration is large, and the surface roughening does not extend to the center of the film of the tubular portion 4b.

As the surface roughening is performed, the phosphorus concentration of the tubular portion 4b of the storage node 4 changes as shown in FIG. 13(b). As shown here, most of phosphorus on the surface of the tubular portion 4b is removed by etching and the phosphorus concentration peak value at a depth of about 300 A also lessens to 6E20 atoms/cm$^3$. However, the phosphorus concentration at the center of the film does not change, indicating that the film quality in this portion does not change.

Then, a dielectric film 5 and a cell plate 6 are formed and an interlayer insulating film 8 is laminated according to the procedure shown in the first embodiment, whereby a semiconductor device containing a capacitor similar to that shown in FIG. 1 can be provided.

For the semiconductor device containing the capacitor 7 formed by the manufacturing method as described above, impurities are implanted under good control so that the impurity phosphorus concentration peak comes to a position at a depth of about 200 A–400 A from the surface of the storage node 4, and slanting rotation implantation is executed, whereby impurity phosphorus can also be uniformly implanted into the inside of the tubular portion 4b of the storage node 4 and the surface of the horizontal portion 4a positioned in the tubular portion 4b, as in the first embodiment.

Further, when the thermal phosphoric acid treatment is executed for the storage node 4 containing the tubular portion 4b of a film, being 1000 A thick, into which impurity ions are implanted, the surface of the region at a depth of 200 A–400 A from the surface of the storage node 4 is roughened under good control. Thus, the surface roughening does not extend to the center of the conductive film forming the storage node 4, problems of breakage, partial lack, etc., of the tubular portion of the storage node 4 can be solved, and the strength of the film itself can be made sufficient.

The surface of the capacitor having the tubular portion, which may be called cylindrical capacitor in some cases, is roughened by executing thermal phosphoric acid treatment for forming random asperities, whereby the surface area about 1.4 times that when the surface roughening process is not executed can be provided, and a large-capacity capacitor can be provided.

Embodiment 3

Next, a third embodiment of the invention will be discussed.

In the first and second embodiments, impurity phosphorus implantation energy into the storage node forming a part of the capacitor formed in the semiconductor device is changed and the impurity implantation angle is changed in response to the implantation energy.

In the third embodiment, the impurity phosphorus implantation energy is set to the same value as in the first embodiment and the implantation amount is set to a low value of 2E14 atoms/cm$^2$.

The final cross-sectional structure of a semiconductor device provided by the third embodiment is similar to that shown in FIG. 1.

In a semiconductor device manufacturing method according to the third embodiment, steps to formation of a tubular portion 4b forming a part of a storage node 4 are similar to those already shown in FIGS. 2–5.

Next, as in FIG. 6, the impurity phosphorus implantation conditions into the surface of the side becoming a counter electrode of the storage node 4 are implantation angle 45 degrees (the same value as in the first embodiment), implantation energy 20 keV (the same value as in the first embodiment), and implantation amount 2E14 atoms/cm$^2$ (a low value) for eight-part split rotation implantation.

The implantation amount is a small value of a fifth of that in the first embodiment. However, as seen in FIG. 14(a), the impurity concentration in the proximity of the surface of polysilicon forming the tubular portion 4b of the storage node 4 (a region at a depth of about 200 A from the surface of the storage node 4) is larger by about 1E20 atoms/cm$^3$ than the impurity phosphorus concentration in the film forming the tubular portion 4b of the storage node 4 (4E20 atoms/cm$^3$).

Therefore, when thermal phosphoric acid treatment at the next step is executed, the polysilicon etching rate becomes high in the proximity of the surface of the storage node 4 where impurity phosphorus is at comparatively high concentration, and microscopic asperities are formed on the surface. However, the surface roughening reaction does not extend to the center (bulk portion) of the film of the tubular portion 4b at comparatively small impurity phosphorus concentration and the asperities are formed only in the portion where impurity phosphorus is highly concentrated by slanting rotation implantation. This phenomenon is also substantiated from the study result of phosphorus concentration dependency of the etching rate shown in FIG. 11.

FIG. 14(b) shows an impurity concentration profile from the surface of the storage node 4 to the film inside thereof after surface roughening. The phosphorus concentration after surface roughening decreases largely on the surface of the tubular portion 4b and becomes smaller at the peak position at a depth of about 200 A than that before surface roughening. The phosphorus concentration decreases at the center of the film due to diffusion, but has a small difference from that before surface roughening and the film quality changes little.

After the surface of the storage node 4 is roughened, as in the first embodiment, annealing is performed, the surface layer of the storage node 4 is activated, a dielectric film 5 and a cell plate 6 are formed, and an interlayer insulating film 8 is laminated thereon, whereby a semiconductor device having a capacitor 7 of a structure similar to that in FIG. 1 can be provided.

For the semiconductor device containing the capacitor thus provided, the region where asperities are formed by roughening the surface is small with respect to the film thickness of the tubular portion 4b forming a part of the storage node 4, so that the strength of the tubular portion 4b itself can be held sufficient and the capacitor can also be put into a large capacity by roughening the surface.

If the impurity phosphorus implantation amount into the storage node 4 is small as a fraction of that in the first or second embodiment, the etching rate is varied according to the difference between the phosphorus concentration on the roughened surface of the storage node 4 and that in the film of the storage node 4 with the unroughened surface, whereby the surface roughening can be performed under good control, needless to say.

Embodiment 4

In the first to third embodiments of the invention previously described, the tubular portion 4b of the storage node 4 forming a part of the capacitor 7 in the semiconductor device is made of polysilicon. A fourth embodiment of the invention is characterized by the fact that a tubular portion 4c of a storage node 4 of a semiconductor device is made of amorphous silicon.

FIG. 15 is a sectional view at a stage where a tubular portion 4c made of amorphous silicon is formed after a horizontal portion 4a of a component of a storage node 4 made of polysilicon is patterned.

After a processed substrate of the structure shown previously in FIG. 3 in the first embodiment is provided, a tube-type low pressure CVD system is used to form a film of amorphous silicon forming the tubular portion 4c under the conditions of film formation temperature 510° C.–530° C. and deposition pressure 0.45 Torr so that the impurity phosphorus concentration in the film becomes 4E20 atoms/cm$^3$ and that the horizontal dimension becomes a film thickness of about 1000 A. Then, anisotropic etching is performed for the amorphous silicon and at least a part of the surface of an interlayer insulating film 2 is exposed. Then, a mask pattern 9 clogged in the tubular portion 4c is removed, whereby a processed substrate of the structure shown in FIG. 15 can be provided.

Then, slanting rotation implantation of impurity phosphorus is executed into the storage node 4. For example, the implantation conditions are implantation energy 20 keV, implantation amount 1E15 atoms/cm$^2$, and implantation angle 45 degrees for eight-part split rotation implantation.

Next, as shown in FIG. 16, thermal phosphoric acid treatment is executed as in the first embodiment, thereby roughening the surface of the storage node 4. Asperities smaller than those formed on the surface of the horizontal portion 4a are formed on the roughened surface of the tubular portion 4c.

The reason why the smaller asperities are formed is that amorphous silicon grains forming the tubular portion 4c are smaller than polysilicon grains forming the horizontal portion 4a and that when phosphorus segregated in the grain boundaries is removed by roughening the surface, the formed asperities become smaller than polysilicon asperities.

As shown in FIG. 11 used previously for the description, it is acknowledged that as the phosphorus concentration dependency of the etching rate of amorphous silicon, the etching rate when amorphous silicon contains impurity phosphorus is larger than that when amorphous silicon does not contain impurity phosphorus; if a part of the storage node 4 is made of amorphous silicon containing impurity phosphorus, good surface roughening is also enabled.

Since slanting rotation implantation of impurity phosphorus is executed into the cylindrical storage node 4, impurity implantation can be well applied to the full surface becoming a counter electrode of the storage node 4 and the impurity concentration peak can be adjusted so that it is formed at a depth of about 200 A from the surface. Therefore, after the surface roughening, the strength of the tubular portion 4c of the storage node 4 can also be maintained, needless to say.

Further this invention is effective for the storage node having a fin structure constituted by a first horizontal portion made of a conductive material in contact with the contact and spread in a horizontal direction on the surface of the interlayer insulating film, and a vertical portion made of a conductive material extending in a vertical direction in contact with the first horizontal portion and a second horizontal portion made of a conductive material in contact with the vertical portion and spread in a horizontal direction.

The effects of the invention corresponding to the claims are described below:

According to the semiconductor device, the impurity phosphorus concentration peak is placed in the region where the surface is roughened in the storage node and the impurity phosphorus concentration in the storage node is changed, whereby the etching rate when thermal phosphoric acid treatment is executed at the surface roughening time can be adjusted and the surface roughening can be performed under good control. Therefore, a sufficiently strong capacitor having a sufficient capacity can be provided.

According to the semiconductor device, the surface of the tubular storage node is roughened, whereby a sufficient capacitance can be provided. Since the surface roughening does not extend to the center of the film forming the storage node, a capacitor having the sufficient strength can be provided.

According to the semiconductor device, the tubular portion of the storage node can be made of polysilicon or amorphous silicon; a sufficiently strong capacitor having a sufficient capacity can be provided regardless of which material is used.

According to the semiconductor device manufacturing method, the phosphorus distribution in the storage node can be changed by executing slanting rotation implantation of phosphorus at the formation stage of the tubular storage node; the surface roughening with thermal phosphoric acid can be adjusted to a good state. Therefore, a sufficiently strong capacitor having a sufficient capacity can be provided.

According to the semiconductor device manufacturing method, implantation energy of impurity phosphorus is 10–50 kev, so that the phosphorus concentration peak and the surface roughening with thermal phosphoric acid can be adjusted to a good state. Therefore, a sufficiently strong capacitor having a sufficient capacity can be provided.

According to the semiconductor device manufacturing method, the impurity phosphorus implantation amount is in the range of $2\times10^{14}$ atoms/cm$^2$ to $1\times10^{16}$ atoms/cm$^2$, whereby the impurity concentration difference from bulk of the storage node can be made 1E20 atoms/cm$^3$ or more. Therefore, when the surface is roughened by thermal phosphoric acid treatment, the etching rate can be changed between the center of the storage node where the surface is not roughened and the portion where the surface is roughened for performing surface roughening under good control. Therefore, a sufficiently strong capacitor having a sufficient capacity can be provided.

According to the semiconductor device manufacturing method, the face roughening range is the range of the surface of the storage node to a depth of less than a half of the dimension of the horizontal film thickness of the tubular portion, so that the surface at the center of the storage node is not roughened. Therefore, a sufficiently strong capacitor having a sufficient capacity can be provided.

According to the semiconductor device manufacturing method, slanting rotation implantation of impurity phosphorus is executed, thereby changing the impurity phosphorus concentration in the storage node for placing the peak of the impurity phosphorus concentration in the range in which the face of the storage node is roughened, whereby the etching rate at the center of the storage node can be lessened; a sufficiently strong capacitor having a sufficient capacity can be provided.

According to the semiconductor device manufacturing method, the material forming the storage node may be polysilicon or amorphous silicon. The surface of the storage node can be roughened for increasing the surface area of the storage node regardless of which material is used. A sufficient capacitance can be provided in addition to the strength capable of maintaining the tubular shape.

According to the semiconductor device, the storage node has a surface whose roughness is uniformly through outer periphery, inner periphery of the tubular portion and a surface of horizontal portion, thereby storage node has a uniform surface state and current concentration is prevented. Therefore a reliable capacitor having accurate capacitance, can be obtained.

According to the semiconductor device, the storage node has a peak value of the impurity concentration at the roughened surface, thereby capacitor having a good contact structure and a large capacitance, can be obtained.

According to the method, the step of etching is controlled to be stopped so as to remain a peak of phosphorus concentration and then executing a heat treatment, thereby contact resistance between storage node and dielectric layer, can be reduced and a capacitor having a larger capacitance, can be obtained.

According to the method, the step further comprises a step of applying phosphorus into a roughened surface, thereby contact resistance between storage node and dielectric layer, can be further reduced and a capacitor having a larger capacitance, can be obtained.

What is claimed is:

1. A semiconductor device comprising:
    an interlayer insulating film laminated on a main face of a semiconductor substrate;
    a contact formed through the interlayer insulating film to a surface of the semiconductor substrate;
    a storage node constituted by a horizontal portion made of a conductive material,in contact with the contact on the surface of the interlayer insulating film and a vertical portion made of the conductive material extending in a vertical direction from the horizontal portion;
    a dielectric film laminated on a surface of the storage node; and
    a cell plate made of a conductive material laminated on a surface of the dielectric film,
    wherein a face from an outer surface of the storage node on a side facing the cell plate to an inner surface of the storage node is roughened and a peak of an impurity phosphorus concentration is positioned in a range in which the face is roughened.

2. The semiconductor device as claimed in claim 1, the vertical portion of the storage node is constituted by a tubular portion made of the conductive material surrounding an outer periphery of the horizontal portion and extending in a vertical direction.

3. The semiconductor device as claimed in claim 2, wherein the range in which the surface of the storage node is roughened is a range of the surface of the storage node to a depth of less than a half of a dimension of a horizontal film thickness of the tubular portion.

4. The semiconductor device as claimed in claim 2, wherein the storage node is made of polysilicon and, the surface of the storage node comprises recesses formed along grain boundaries of polysilicon.

5. The semiconductor device as claimed in claim 2, wherein the storage node is made of amorphous silicon and the surface of the storage node comprises recesses formed along grain boundaries of polysilicon.

6. The semiconductor device as claimed in claim 2, wherein the storage node has a surface whose roughness is uniform through an outer periphery, an inner periphery of the tubular portion and a surface of horizontal portion.

7. The semiconductor device as claimed in claim 2, wherein the storage node has a peak of the impurity phosphorus concentration at the roughened surface.

8. The semiconductor device as claimed in claim 2, wherein the tubular portion of the storage node is 1000 A thick and a depth of the recess of the roughened surface is 200–400 A.

9. The semiconductor device as claimed in claim 1, wherein the storage node is a fin structure constituted by a first horizontal portion made of a conductive material in contact with the contact and spread in a horizontal direction on the surface of the interlayer insulating film, and a vertical portion made of a conductive material extending in a vertical direction in contact with the first horizontal portion and a second horizontal portion made of a conductive material in contact with the vertical portion and spread in a horizontal direction.

10. A method of manufacturing a semiconductor device, comprising the steps of:
    laminating an interlayer insulating film on one main face of a semiconductor substrate;
    forming a contact in the interlayer insulating film so as to come in contact with the semiconductor substrate;
    forming a horizontal portion made of a conductive material spread in a horizontal direction so as to come in contact with the contact on the interlayer insulating film;
    forming a tubular portion made of a conductive material being in contact with an outer periphery of the horizontal portion extending upward like a tube for producing a storage node made up of the horizontal portion and the tubular portion;
    roughening a surface of the storage node comprising a step of executing slanting rotation implantation of impurity phosphorus into the storage node made up of the horizontal portion and the tubular portion and executing thermal phosphoric acid treatment for the storage node for roughening a face thereof;
    laminating a dielectric film on a surface of the storage node;

and laminating a conductive material becoming a cell plate on a surface of the dielectric film.

11. The method of manufacturing the semiconductor device as claimed in claim 10, wherein implantation energy of impurity phosphorus is 10–50 keV in the step of executing slanting rotation implantation.

12. The method of manufacturing the semiconductor device as claimed in claim 10, wherein an impurity phosphorus implantation amount is in a range of $2\times10^{14}$ atoms/cm$^2$ to $1\times10^{16}$ atoms/cm$^2$ in the step of executing slanting rotation implantation.

13. The method of manufacturing the semiconductor device as claimed in claim 10, wherein the face roughening range is a range of the surface of the storage node to a depth of less than a half of a dimension of a horizontal film thickness of the tubular portion.

14. The method of manufacturing the semiconductor device as claimed in claims 10, wherein the step of executing slanting rotation implantation of impurity phosphorus is so as to change the impurity phosphorus concentration in the storage node for placing a peak of the impurity phosphorus concentration in a range in which the face of the storage node is roughened.

15. The method of manufacturing the semiconductor device as claimed in claim 10, wherein the conductive material is a polysilicon and the step of executing slanting rotation implantation of impurity phosphorus is a step of implanting impurity phosphorus in the grain boundary of the polysilicon deeper than other portion, and a step of executing thermal phosphoric acid treatment is etching the grain boundary selectively.

16. The method of manufacturing the semiconductor device as claimed in claim 10, wherein the conductive material is an amorphous silicon and the step of executing slanting rotation implantation of impurity phosphorus is a step of implanting impurity phosphorus in the grain boundary of the amorphous silicon deeper than other portion, and a step of executing thermal phosphoric acid treatment is etching the grain boundary selectively.

17. The method of manufacturing the semiconductor device as claimed in claim 15, wherein the step of etching is controlled to be stopped so as to remain a region having a peak of phosphorus concentration and then executing a heat treatment.

18. The method of manufacturing the semiconductor device as claimed in claim 15, wherein the step of roughening comprises a step of applying phosphorus after thermal phosphoric acid treatment.

* * * * *